United States Patent [19]

Olver

[11] Patent Number: 4,926,134

[45] Date of Patent: May 15, 1990

[54] GAIN MONITORING OF DISTORTION CANCELLATION AMPLIFIERS IN A FEEDFORWARD LINEAR AMPLIFIER

[75] Inventor: Terence E. Olver, Catonsville, Md.

[73] Assignee: Westinghouse Electric Corp., Pittsburgh, Pa.

[21] Appl. No.: 291,599

[22] Filed: Dec. 29, 1988

[51] Int. Cl.⁵ ............................................. H03F 1/32
[52] U.S. Cl. ....................................... 330/2; 330/149; 330/151
[58] Field of Search ....................... 330/2, 52, 149, 151

[56] References Cited

U.S. PATENT DOCUMENTS

| | | | |
|---|---|---|---|
| 3,471,798 | 10/1969 | Seidel | 330/151 X |
| 4,517,521 | 5/1985 | Preschutti et al. | 330/151 X |
| 4,625,178 | 11/1986 | Mannerstrom | 330/149 |
| 4,694,258 | 9/1987 | Blumenkane et al. | 330/151 X |

FOREIGN PATENT DOCUMENTS

| | | | |
|---|---|---|---|
| 166206 | 7/1986 | Japan | 330/149 |
| 005706 | 1/1987 | Japan | 330/149 |

*Primary Examiner*—James B. Mullins
*Attorney, Agent, or Firm*—W. G. Sutcliff

[57] ABSTRACT

A monitor signal injection system for a feedforward cancellation amplifier having at least one stage in which monitor signals having a constant relatively large amplitude are injected into, for example, a main amplifier. The monitor signals are used to measure the status of all individual components of the amplifier and are useful for fault detection and isolation. In addition, the monitor signals are cancelled in the output to a very low level and as a result, on-line monitoring can be performed without significant radiation of power from a load antenna.

5 Claims, 2 Drawing Sheets

MONITOR SIGNAL INJECTION

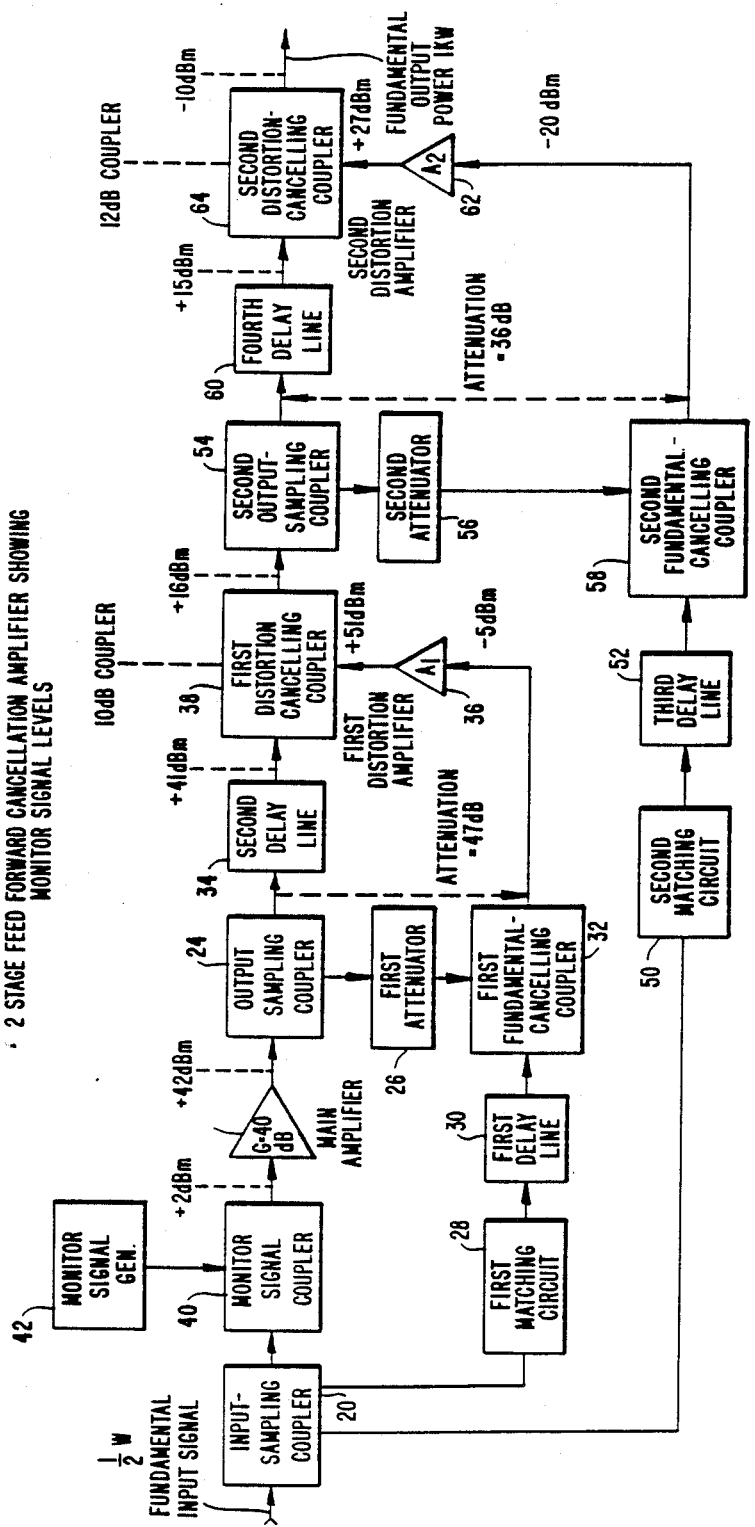

GAIN MONITORING OF DISTORTION CANCELLATION AMPLIFIERS IN A FEEDFORWARD LINEAR AMPLIFIER

CROSS-REFERENCE TO RELATED APPLICATION

This reference is cross-referenced to U.S. application entitled "A Gain Variation Compensating Circuit for a Feedforward Linear Amplifier", by Terence E. Olver, having Ser. No. 07/291,600, filed Dec. 29, 1988.

BACKGROUND OF THE INVENTION (1) Field of the Invention

The present invention performs status monitoring of a feedforward cancellation power amplifier by applying levels of radio frequency (RF) monitor signals within the feedforward cancellation power amplifier. The on-line monitoring of the monitor signals can be performed without significant radiation of monitor signal power from a load antenna because the inherent properties of the feedforward cancellation power amplifier are employed and, as a result, the monitor signals are cancelled to a very low level in the output. The monitor signals are used to measure the status of all individual components of the amplifier dealing with RF signals, such as power amplifiers, distortion cancellation amplifiers, and output circuit components.

(2) Description of the Related Art

Prior art systems for status monitoring use operational communication signals for RF monitoring. The signals have the disadvantage of a large dynamic range necessitating complex RF detection equipment. They are also not suitable for monitoring distortion amplifiers.

Ultra-linear high power amplifiers employ feedforward cancellation to achieve high linearity. Feedforward cancellation employs distortion amplifiers to generate signals that cancel distortion and noise in the output of the ultralinear amplifier. Two cancellation loops are usually employed for a single stage. For example, as set forth in U.S. application Ser. No. 07/291,605 entitled "A Gain Variation Compensating Circuit for a Feedforward Linear Amplifier", by Terence E. Olver, (incorporated by reference herein), two cancellation loops are used for a single stage. Loop 1 includes a main amplifier which is the principle source of power amplification and serves to separate distortion and noise power generated by the main amplifier from fundamental input signals. This is accomplished by subtracting a sample of the output power taken at the output sampling coupler and attenuator, from a sample of an input signal. The input signal sample is taken by way of the input sam coupler, matching circuit and delay line. Actual subtraction is performed in the fundamental cancelling coupler. Careful phase and amplitude matching of the two samples fed into the cancelling coupler must be maintained across a frequency band of approximately 2 to 30 MHz for high frequency power amplifiers. The quality of matching determines the residue of the fundamental signal left after subtraction in the output of the fundamental cancelling coupler. This output, containing phase inverted distortion and noise signals, plus the fundamental residue, forms an input to the distortion amplifier where it is amplified and then injected into the distortion cancelling coupler.

Loop 2 includes two signal paths which are carefully matched in phase and gain. The distortion cancelling signal path is from the output sampling coupler by way of an attenuator, fundamental cancelling coupler, distortion amplifier and a distortion cancelling coupler. The high power signal path is from the output sampling coupler by way of the delay line and the distortion cancelling coupler. Matching is performed so that across the frequency band the distortion and noise signals injected into the output from the distortion cancelling path of loop 2 are equal in amplitude, but are 180° out of phase with those signals coupled from the main amplifier directly by way of the delay line. As a result, distortion and noise are cancelled in the output. Also directly coupled to the output are the high power fundamental signals providing the power output, which are not cancelled.

Phase matching is performed by carefully adjusting the time delay in both paths so that the phases are equal. The delay line is the main component used for phase matching. Gain matching is performed by adjusting the gain of the distortion amplifier for optimum broad band conditions so that the amplitude of the signals is equalized. The gain of the distortion amplifier and the stability of its operation are therefore critical to the degree of distortion cancellation in the output and thus, to the linearity of the distortion amplifier. The gain monitoring of the power amplifiers that form the main amplifier is performed on-line by monitoring and comparing the gain between the input and output signals. This is relatively simple to perform since the amplified signals are usually large (many watts) for high power amplifiers and small samples sufficiently large to operate detectors are readily obtained.

Communication traffic signals are used for on-line monitoring but these signals have a large dynamic range, e.g., up to 50 dB. This is not acceptable for a distortion amplifier. In a distortion amplifier, signals consist of cancelled fundamental residue plus distortion and noise. At the input to the distortion amplifier the largest signals are approximately 1 milliwatt. During normal traffic conditions, the signals will be much smaller and may extend downward over a dynamic range of approximately 50 dB. It is difficult to sample and detect such signals and thus determine the gain of the distortion amplifier.

The present invention uses special in-band signals strictly for monitoring purposes. In the past, there has been objection to using in-band signals because injection of the signals into the amplifier can result in coupling to the output with the signals being radiated from any antenna connected to the amplifier output. Use of a high power switch to disconnect the output from the antenna is not possible for the reason that a high power very linear changeover switch is not available. In addition, such a switch would be costly and less reliable than not using a switch.

SUMMARY OF THE INVENTION

An object of the present invention is to provide a low cost monitor signal system for injecting monitor signals into an amplifier with the monitor signal components being coupled by the amplifier to the output so as to be exactly cancelled by signals of equal amplitude.

Another object of the present invention is to provide a monitor signal system in which monitor signals are used to measure the status of individual components of the amplifier.

It is a further object of the present invention to provide a monitor signal system in which monitor signals are useful for fault detection and isolation.

Yet another object of the present invention is to provide a monitor signal system in which monitor signals are provided for monitoring distortion amplifiers with the monitor system signals being injected at a relatively constant large amplitude so that simple RF detectors can be employed.

The above-mentioned objects of the present invention are obtained by providing a monitor signal injection system including a monitor signal generator for generating monitor signals for a feedforward amplifier and a monitor signal coupler coupled to a main amplifier in the feedforward amplifier for injecting monitor signals into the main amplifier.

In addition, the above-mentioned objects of the present invention are obtained by providing, in a feedforward cancellation amplifier, which includes an input sampling coupler for receiving input signals, a main amplifier coupled to the input sampling coupler, an output sampling coupler coupled to the main amplifier, an attenuator coupled to the output sampling coupler, a matching circuit coupled to the input sampling coupler, a first delay circuit coupled to the matching circuit, a fundamental cancelling coupler coupled between the first delay circuit and the attenuator, a second delay line coupled to the output sampling coupler, a distortion amplifier coupled to the fundamental cancelling coupler, and a distortion cancelling coupler coupled between the distortion amplifier and the second delay line for outputting power, a monitor signal injection system comprising a monitor signal generator for generating monitor signals and a monitor signal coupler coupled to the input of the main amplifier for injecting monitor signals into the main amplifier. The monitor signals are constant at relatively large amplitudes in the amplifier with a level for sampling always greater than −20 dBm. However, the level of monitor signals in the output of the feedforward amplifier is approximately −10 dBm. This is much less than the minimum signal for the operational range of a 1 kilowatt amplifier.

These objects, together with other objects and advantages which will be subsequently apparent, reside in the details of construction and operation as more fully hereinafter described and claimed, reference being had to the accompanying drawings forming a part hereof, wherein like reference numerals refer to like parts throughout.

BRIEF DESCRIPTION OF THE DRAWINGS

FIG. 2 is a monitor signal injection system according to a second embodiment of the present invention including a two-stage feedforward cancellation amplifier.

DESCRIPTION OF THE PREFERRED EMBODIMENTS

Figure 1:
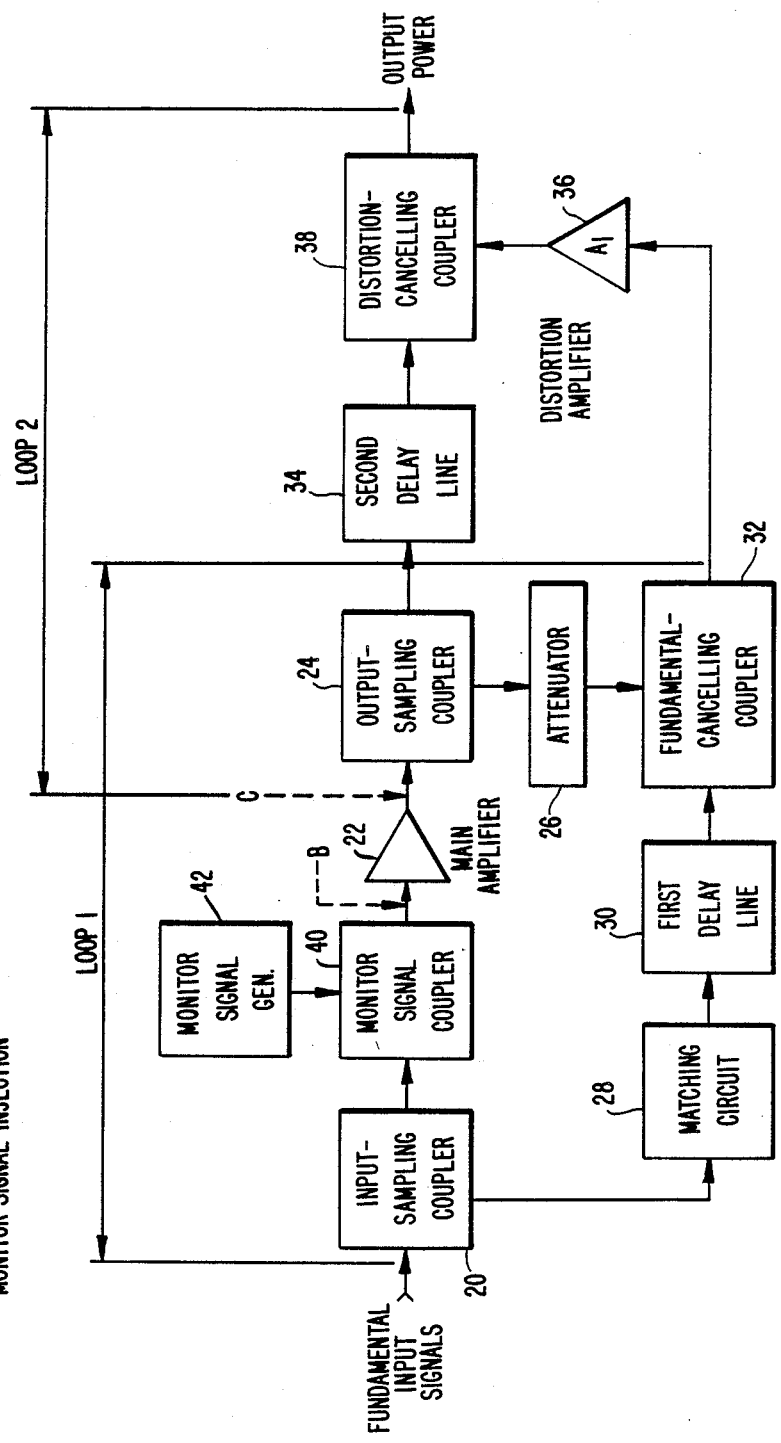
FIG. 1 is a bloCk diagram of a monitor signal injection system according to a first embodiment of the present invention.

FIG. 1 of the present invention is a block diagram of a first embodiment according to the present invention. The monitor injection system of the present invention is used in a feedforward cancellation amplifier. The feedforward cancellation amplifier includes a first loop 1 and a second loop 2 as taught by Westinghouse Application to Terence E. Olver, entitled "A Gain Variation Compensating Circuit for a Feedforward Linear Amplifier", as incorporated by reference herein above. The first loop 1 is a fundamental cancelling loop and includes an input sampling coupler 20 connected to receive fundamental input signals, a main amplifier 22 coupled to the input sampling coupler, an output sampling coupler 24 connected to the main amplifier 22, an attenuator 26 connected to the output sampling coupler, a matching circuit 28 connected to a second output of the input sampling coupler 20, a first delay line 30 connected to the output of the matching circuit 28, and a fundamental cancelling coupler 32 connected to the first delay line 30 and the attenuator 26. The above circuit elements are all conventional elements.

The second loop 2 is a distortion cancelling loop and includes the output sampling coupler 24, the attenuator 26, and the fundamental cancelling coupler 32. In addition, the second loop 2 includes a second delay line 34 connected to the output sampling coupler 24, a distortion amplifier 36 connected to the fundamental cancelling coupler 32 and a distortion cancelling coupler 38 connected to the second delay line 34 and the distortion amplifier 36. A monitor signal coupler 40 is connected between the input sampling coupler 20 and the main amplifier 22. A monitor signal generator 42 is connected to the monitor signal coupler 40 for providing a monitor signal to the monitor signal coupler 40. These circuit elements are all conventional elements.

The monitor signal coupler 40 injects the monitor signal from the monitor signal generator 42 into the main amplifier 22. The monitor signals are injected at a constant relatively large amplitude so that simple radio frequency (RF) detectors can be used to monitor the signals. In addition, since a monitor injection system is used following the sampling of the input signals and since the monitor signals appear as distortion or noise in the output of the main amplifier then the monitor signals are cancelled in the output of the feedforward cancellation amplifier to a very small level and, as a result, on-line monitoring can be performed without significant radiation of power from a load antenna. The monitor signals are used to measure the status of all individual components of the amplifier and are used for fault detection and isolation. The monitor signals from the monitor signal generator 42 coupled by the main amplifier 22 to the output of the feedforward cancellation amplifier via the output sampling coupler 24, the second delay line 34 and the distortion cancelling amplifier 38, are exactly cancelled by signals of equal amplitude coupled by way of the output sampling coupler 24, attenuator 26, fundamental cancelling coupler 32, distortion amplifier 36 and the distortion cancelling coupler 38. The careful matching of the cancelling loops 1 and 2 needed for normal operation insures that the monitor signals cancel in the output. Because the monitor signals are coupled by the main amplifier 22 and are not coupled into the input signal path, they are present in the output of the main amplifier 22 as is distortion and noise. Since these signals are not present in the input signals, they are cancelled in the output of the feedforward cancellation amplifier in the same way that distortion and noise are cancelled.

A variation of the first embodiment includes injecting monitor signals into the feedforward cancellation amplifier at a point C in FIG. 1, which is at the output of the main amplifier 22, by a circuit similar to the monitor signal coupler 40. This enables monitoring of the cancellation circuits independent of the main amplifier 22.

Cancellation of the monitor signals still occurs at the output of the feedforward cancellation amplifier.

FIG. 2 is a two-stage feedforward cancellation amplifier according to a second embodiment of the present invention including the monitor injection system. In FIG. z, the first stage includes the circuit set forth in FIG. 1. As set forth above, these circuit elements are all conventional elements. A second stage is provided which includes a second matching circuit 50 connected to the input sampling coupler 20, a third delay line 52 connected to the matching circuit 50, a second output sampling coupler 54 connected to the output of the distortion cancelling coupler 38, a second attenuator 56 connected to the output of the output sampling coupler, a second fundamental cancelling coupler 58 connected to the attenuator 56 and the third delay line 52. In addition, a fourth delay line 60 is provided connected to the second output sampling coupler 54 and a second distortion amplifier 62 is connected to the second fundamental cancelling coupler 58. A second distortion cancelling coupler 64 is connected to the fourth delay line 60 and the second distortion amplifier 62. These circuit elements are all similar to those in the first and second loops in FIG. 1.

FIG. 2 shows the various monitor signal levels in terms of their power at various points within the feedforward cancellation amplifier. In order to determine whether each portion of the amplifier is working, these signals can be detected at various points by employing a conventional probe such as a directional coupler type probe, or any other type probe, and can be compared with what the known levels, etc., should be. In FIG. 2, although a two-stage feedforward cancellation amplifier is shown, more than two stages can be accommodated if needed to cancel more distortion in the output. The various points in this system have been calculated assuming 25 dB of cancellation per stage of feedforward cancellation.–At all points, the level of the monitor signal for sampling is greater than—20 dBm. This is satisfactory for monitoring purposes. At the output, the level of the monitor signal after cancellation is —10 dBm. This is approximately 10 dB lower than the lowest level of operational signals which for a 1 kilowatt signal and an amplifier having a 60 dB range of power operation would be at 0 dBm. Therefore, the circuits can function with the injected monitor signals with very little power being radiated by an antenna at the output, because of the reduction due to the operation of the cancellation circuits. Because the monitor signals have a constant amplitude they are simple to detect and monitor, and do not disturb the operation of the system while providing a check on the distortion amplifier to determine that it is working properly. The system is a built-in test system for the feedforward cancellation amplifier.

The features of the present invention provide a monitor signal injection system in which monitor signals are suitable for monitoring distortion amplifiers and other circuits in a feedforward cancellation amplifier since they are injected at a constant relatively large amplitude and simple RF detectors (i.e., a conventional probe) can be used. The monitor signals are cancelled in the output to a very low level and as a result on-line monitoring can be performed without significant radiation of power from a load antenna.

The many features and advantages of the invention are apparent from the detailed specification and, thus, it is intended by the appended claims to cover all such features and advantages of the system which fall within the true spirit and scope of the invention. Further, since numerous modifications and changes will readily occur to those skilled in the art, it is not desired to limit the invention to the exact construction and operation shown and described, and accordingly all suitable modifications and equivalents may be resorted to, falling within the scope of the invention.

What is claimed is:

1. A monitor signal injection system for monitoring defects in circuit in a feedforward cancellation amplifier, comprising:
    an input sampling coupler;
    a monitor signal generator for generating monitor signals;
    a monitor signal coupler, connected to said monitor signal generator and said input sampling coupler, for injecting monitor signals for monitoring circuits in the feedforward cancellation amplifier;
    a main amplifier connected to said monitor signal coupler;
    an output sampling coupler connected to said main amplifier;
    an attenuator connected to said output sampling coupler;
    a matching circuit connected to said input sampling coupler;
    a first delay line connected to said matching circuit;
    a fundamental cancelling coupler connected to said attenuator and said first delay line;
    a distortion amplifier connected to said fundamental cancelling coupler;
    a second delay line connected to said output sampling coupler; and
    a distortion cancelling coupler, connected to said second delay line and said distortion amplifier, for cancelling the monitor signals along with distortion and noise.

2. A monitor signal injection system according to claim 1, wherein the level of monitoring signals for monitoring is greater than −20 dBm, and wherein the level of monitor signals output is approximately −10 dBm.

3. A monitor signal injection system for monitoring defects in various circuits, comprising:
    an input sampling coupler for receiving input signals;
    a first feedforward cancellation amplifier including:
        a main amplifier coupled to said input sampling coupler;
        a first output sampling coupler coupled to said main amplifier;
        a first attenuator coupled to said first output sampling coupler;
        a first matching circuit coupled to said first input sampling coupler;
        first delay means, coupled to said first matching circuit, for receiving and delaying the input signals;
        a first fundamental cancelling coupler coupled between said first delay means and said first attenuator;
        second delay means coupled to said first output sampling coupler;
        a first distortion amplifier coupled to said first fundamental cancelling coupler; and
        a first distortion cancelling coupler coupled between said first distortion amplifier and said second delay means, for outputting a power;

a monitor signal generator for generating monitor signals;

a monitor signal coupler, connected to said input sampling coupler and said monitor signal generator, for injecting constant amplitude monitor signals into said main amplifier;

a second feedforward cancellation amplifier coupled to said first feedforward cancellation amplifier including:

a second matching circuit coupled to said input sampling coupler;

third delay means, coupled to said second matching coupler, for providing delay signals;

a second output sampling coupler coupled to said first distortion cancelling coupler;

a second attenuator coupled to said second output sampling coupler;

a second fundamental cancelling coupler coupled to said second attenuator and said third delay means;

a second distortion amplifier coupled to said second fundamental cancelling coupler;

fourth delay means, coupled to said second output sampling coupler; and a second distortion cancelling coupler, coupled to said fourth delay means and said second distortion amplifier, for outputting a fundamental output power.

4. A monitor signal injection system according to claim 3, wherein levels of monitor signals from said monitor signal generator are always greater than $-20$ dBm, and the level of monitor signals output is approximately $-10$ dBm.

5. A monitor signal injection system according to claim 4, wherein said first and second distortion cancelling couplers cancel the monitor signals along with distortion and noise.

* * * * *